(12) United States Patent
Ramian et al.

(10) Patent No.: US 11,366,193 B2
(45) Date of Patent: Jun. 21, 2022

(54) METHOD OF SETTING A MEASUREMENT INSTRUMENT AND SYSTEM FOR SETTING A MEASUREMENT INSTRUMENT

(71) Applicant: Rohde & Schwarz GmbH & Co. KG, Munich (DE)

(72) Inventors: Florian Ramian, Munich (DE); Darren Tipton, Munich (DE); Martin Lim, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 160 days.

(21) Appl. No.: 16/575,987

(22) Filed: Sep. 19, 2019

(65) Prior Publication Data

US 2021/0088615 A1    Mar. 25, 2021

(51) Int. Cl.
*G01R 23/04* (2006.01)
*G01R 35/00* (2006.01)
*G01R 23/00* (2006.01)

(52) U.S. Cl.
CPC ......... *G01R 35/007* (2013.01); *G01R 23/005* (2013.01); *G01R 23/04* (2013.01)

(58) Field of Classification Search
CPC .... G01R 35/007; G01R 23/04; G01R 23/005; G01R 33/3607; G01R 33/3852; G01R 33/54
See application file for complete search history.

(56) References Cited

U.S. PATENT DOCUMENTS

| 6,359,429 B1* | 3/2002 | Arai | G01R 23/16 |
| | | | 324/76.23 |
| 2007/0096720 A1* | 5/2007 | Clements | G01R 35/007 |
| | | | 324/601 |

\* cited by examiner

*Primary Examiner* — Lee E Rodak
*Assistant Examiner* — Brent J Andrews
(74) *Attorney, Agent, or Firm* — Schwabe Williamson & Wyatt

(57) ABSTRACT

A setting of a measurement instrument comprises the providing a reference measurement instrument that uses at least one instrument parameter. A training phase is performed for a particular signal type to be processed by said reference measurement instrument in order to retrieve an optimal setting for said at least one instrument parameter. A lookup table is created for said particular signal type, said lookup table comprising at least said optimal setting for said at least one instrument parameter.

12 Claims, 1 Drawing Sheet

METHOD OF SETTING A MEASUREMENT INSTRUMENT AND SYSTEM FOR SETTING A MEASUREMENT INSTRUMENT

FIELD OF THE DISCLOSURE

Embodiments of the present disclosure relate to a method of setting a measurement instrument. Further, embodiments of the present disclosure relate to a system for setting a measurement instrument.

BACKGROUND

In typical measurement methods using measurement instruments, it is required to set an instrument parameter of the measurement instrument in a certain manner so that a proper measurement can be performed by means of the measurement instrument. Depending on the type of the measurement instrument, different settings have to be used in order to set the respective measurement instrument in a proper manner.

In fact, an operator of the measurement instrument requires a routine that quickly configures the respective measurement instrument so that a measurement result is optimized. This is especially important for production environments. The optimization typically corresponds to minimizing a measurement uncertainty.

However, optimized settings of the measurement instrument do not only depend on the characteristics of the measurement instrument itself, for instance compression and analog-to-digital (ADC) full scale, and the signal characteristics, for instance root mean square (RMS) level and/or peak-to-average power ratio (PAPR), but also on the measurement to be performed.

Current implementations known in the state of the art typically relate to a so-called auto level that, however, does not take the specific type of measurement into account. Alternatively, the auto level implementations known so far simply optimize for a signal-to-noise ratio or low distortion. However, those settings may not be ideal for other measurements to be performed, for instance for an Error Vector Magnitude (EVM) measurement or an Adjacent Channel Leakage Power Ratio (ACLR) measurement. In fact, a signal-to-noise ratio (SNR) optimization is typically good for EVM measurements wherein a low distortion is good for ACLR. However, often EVM and ACLR are measured at the same time.

Accordingly, there is a need for a method and a system that ensure an optimized configuration of a respective measurement instrument with respect to the type of measurement to be performed.

SUMMARY

Embodiments of the present disclosure provide a method of setting a measurement instrument. The method comprises the steps of:
Providing a reference measurement instrument that uses at least one instrument parameter;
Performing a training phase for a particular signal type to be processed by said reference measurement instrument in order to retrieve an optimal setting for said at least one instrument parameter; and
Creating a lookup table for said particular signal type, said lookup table comprising at least said optimal setting for said at least one instrument parameter.

Further, embodiments of the present disclosure provide a system for setting a measurement instrument. The system comprises a reference measurement instrument that has a processing module, at least one processing module and a storage medium. The at least one signal processing module is assigned to the at least one instrument parameter. The at least one signal processing module is configured to process a signal of a particular signal type. The processing module is configured to retrieve an optimal setting for said at least one instrument parameter. The processing module is also configured to create a lookup table for said particular signal type. The lookup table comprises at least said optimal setting for the at least one instrument parameter. The storage medium is configured to store the lookup table created.

Accordingly, the method of and the system for setting a measurement instrument are based on a lookup table that contains at least the necessary instrument settings, namely the optimal setting for the measurement instrument. Accordingly, the lookup table comprises the optimal setting for the at least one instrument parameter that is assigned to the at least one signal processing module that processes a signal inputted.

Generally, the lookup table is populated during the training phase that is performed in order to create the lookup table. Put differently, the entries of the lookup table are generated during the training phase.

The training phase may relate to a simple brute force or a more sophisticated method in order to find the optimal setting for the at least one instrument parameter, namely the ideal settings for the respective measurement intended.

During the training phase, a measurement value assigned to said at least one instrument parameter is measured, for instance a power level such as the root mean square power (RMS power) over a given bandwidth and time. The at least one instrument parameter is adapted so as to identify the optimal setting for said at least one instrument parameter. Typically, the optimal setting for said at least one instrument parameter corresponds to a minimum measurement uncertainty.

The bandwidth and time are specific for the particular signal type.

Accordingly, the lookup table created is specific for at least the particular signal type.

In other words, the method differs from a typical auto level method in that it is not a fixed method of finding potential optimal instrument parameters. The auto level methods known do not differ between different types of signals. In contrast to the auto level methods, the lookup table ensures that the optimal setting for the at least one instrument parameter is retrieved form the respective lookup table for the particular signal type.

Accordingly, an ideal levelling setting is obtained that may also depend on a DUT's margin.

For instance, the ideal (golden) levelling setting is between a SNR optimized and a distortion optimized setting. If the EVM margin is large, but ACLR margin is small, the ideal levelling setting is more towards the ACLR optimum because the ultimate goal is to maximize yield with a minimum investment in measurement instruments.

As mentioned above, the particular signal type may relate to certain characteristics of the signal such as level, for instance a RMS level, crest factor and/or signal bandwidth of the signal. These characteristics of the respective signal have a remarkable effect on the behavior of the measurement instrument when processing the respective signal. In fact, the signal bandwidth leads to a frequency response of the measurement instrument wherein a narrow bandwidth yields a different frequency response compared to a wide bandwidth.

An aspect provides that optimal settings for several instrument parameters are retrieved during the training phase, wherein the lookup table comprises the optimal settings for the several instrument parameters. In fact, the measurement instrument may comprise different signal processing modules that each have an influence on the overall behavior of the measurement instrument. The different signal processing modules are assigned to different instrument parameters, wherein these different instrument parameters are obtained in order to retrieve optimal settings for all signal processing modules used.

The training phase may comprise a set of measurements for the particular signal type. Thus, the optimal setting for the at least one instrument parameter can be retrieved due to the different measurements performed during the training phase.

Another aspect provides that said instrument parameter relates to at least one of the signal processing parameter and an instrument hardware parameter. The signal processing parameter may relate to a software setting according to which the signal is processed in a certain manner. The instrument hardware parameter may relate to a setting of a hardware component of the measurement instrument. Generally, the hardware component of the measurement instrument corresponds to the signal processing module.

For instance, the instrument hardware parameter may be assigned to a certain setting of the hardware component of the measurement instrument, for instance a certain level. Moreover, the instrument hardware parameter may relate to the operation condition of the respective hardware component. This means that the instrument hardware parameter may relate to the status of the respective hardware component, namely activated or rather deactivated.

Moreover, said instrument parameter may be assigned to at least one of an attenuator of said reference measurement instrument, a preamplifier of said reference measurement instrument, a reference source of said reference measurement instrument, a mixer of said reference measurement instrument and an analog-to-digital converter of said measurement instrument. Thus, the at least one signal processing module may be an attenuator, a preamplifier, a reference source, a mixer and/or an analog-to-digital converter.

The respective parameter may correspond to an (radio frequency) attenuation setting, an (radio frequency) amplification reference level, a mixer level, which is the outcome of the reference level, the preamplifier setting and the attenuation. Further, the instrument parameter may correspond to an analog-to-digital converter level.

In fact, the instrument parameter may be assigned to each of the different hardware components used by the measurement instrument for processing the respective signal.

Another aspect provides that an array with more than two dimensions is created. Typically, a lookup table relates to a two dimensional array, whereas a tensor has three different dimensions. Thus, the tensor relates to a three dimensional array. Accordingly, the lookup table can be used as a part of the higher dimensional array, for instance the array. Put differently, the higher dimensional array may be created for more dimensions. Particularly, the respective dimensions may relate to a given input power, a crest factor and/or a frequency of the signal. The respective characteristics of the signal may be used to characterize the particular signal type. Furthermore, the bandwidth and/or time may relate to a certain dimension of the higher dimensional array.

Accordingly, said training phase may be performed for a given input power, a crest factor and/or a frequency. This means that the different measurements performed during the training phase relate to the same given input power, the same crest factor and/or the same frequency such that the corresponding measurement results can be used to identify the optimal setting for the at least one instrument parameter. In fact, the respective measurements relate to the same particular signal type.

Further, said lookup table may be created for at least one of the given input power, the crest factor and the frequency. As mentioned above, the lookup table may be part of an array with more than two dimensions that may be assigned to the given input power, the crest factor and/or the frequency, namely characteristics of the particular signal type. Thus, the respective lookup table or rather the array may depend on one of these specific characteristics of the signal to be processed.

Moreover, the method comprises the steps of:
Performing an initial measurement on the measurement instrument in order to gather an measurement value assigned to said at least one instrument parameter;
Accessing said lookup table in order to retrieve said optimal setting for said at least one instrument parameter stored in said lookup table; and
Applying said optimal setting for said at least one instrument parameter in order to set the measurement instrument.

Thus, the measurement instrument to be set by the method relates to a device under test (DUT) that is tested after creating the lookup table. The measurement instrument or rather the device under test is set based on the lookup table for the particular signal type. The initial measurement performed on the measurement instrument, namely the device under test, may be assigned to the crest factor, the power and/or the frequency. Thus, the measurement value obtained relates to the crest factor, the signal power and/or the frequency.

Based on these measurement value(s), an optimal setting for at least one of the several instrument parameters may be retrieved form the lookup table that is accessed. The instrument parameter retrieved is applied on the measurement instrument such that the measurement instrument is configured in an optimized manner.

In other words, the lookup table is created at the beginning based on the training phase that may use a set of different measurements in order to identify the optimal setting for the at least one instrument parameter. Then, the lookup table is created and populated with at least one optimal setting for the at least one instrument parameter as well as measurement values assigned thereto. The measurement value may relate to a level, for instance a power level.

Afterwards, a measurement instrument to be set is measured and analyzed in order to identify and apply the optimal setting for the respective measurement instrument based on the lookup table created previously. Therefore, the initial measurement is performed on the respective measurement instrument in order to gather the respective measurement value that is used when accessing the lookup table in order to retrieve the optimal setting for the at least one instrument parameter.

The initial measurement relates to the particular signal type that is assigned to the lookup table created. Thus, the initial measurement may be done for a given bandwidth and time since these parameters inter alia define the measurement intended.

Based on the measurement value obtained during the initial measurement, the already created lookup table provides the optimal setting for the at least one instrument parameter that can be set directly without any additional measurement. Thus, it is possible to set the measurement instrument in an optimized manner based on the lookup table for the particular signal type used by a certain measurement scenario.

In other words, the lookup table contains the necessary optimal settings for the measurement instrument, for instance radio frequency attenuation and/or reference level, such that the measurement instrument can be set in an optimal manner based on the initial measurement, for instance the initial power measurement.

The reference measurement instrument may correspond to the measurement instrument on which the initial measurement is performed or to a measurement instrument of the same series (same family). This ensures that the respective optimal settings stored in the lookup table can be used for the measurement instrument even though they have been obtained during the training phase performed on the reference measurement instrument. In fact, it is assumed that measurement instruments of the same series (family) do have a substantially similar behavior such that the respective optimal settings are interchangeable among each other.

As discussed above, the measurement instrument and the reference measurement instrument may be the same measurement instrument in a specific embodiment of the present disclosure.

However, the general concept of the present disclosure relates to several similar measurement instruments of the same series.

DESCRIPTION OF THE DRAWING

The forgoing aspects and many of the attended advantages of the claimed subject matter will become more readily appreciated as the same become better understood by reference to the following detailed description, when taken in conjunction with the accompanying drawings, wherein:

DETAILED DESCRIPTION

Figure 1:
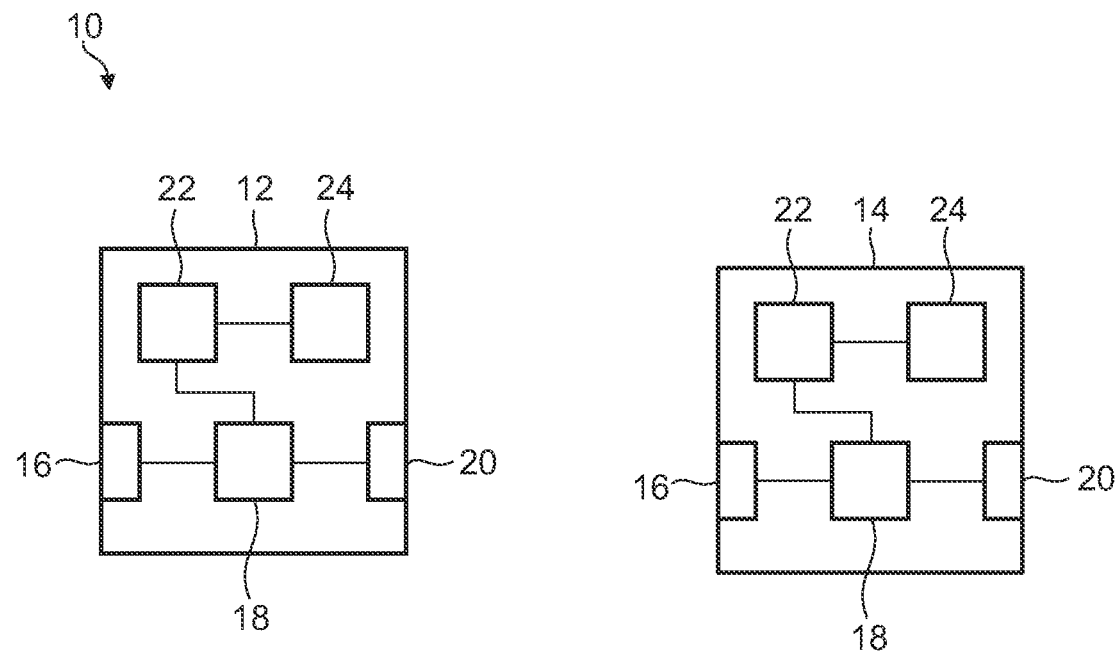
FIG. 1 schematically shows a system for setting a measurement instrument according to the present disclosure.

FIG. 1 shows schematically a system 10 for setting a measurement instrument 12.

In the shown embodiment, the system 10 comprises the measurement instrument 12 as well as a separately formed reference measurement instrument 14. The measurement instrument 12 and the measurement instrument 14 relate to the same series (family). Put differently, the measurement instrument 12 and the reference measurement instrument 14 are interchangeable with each other.

In an alternative (specific) embodiment, the measurement instrument 12 and the reference measurement instrument 14 may be the same measurement instrument.

The measurement instrument 12 and the reference measurement instrument 14 each comprise an input 16, at least one signal processing module 18 and an output 20.

Generally, the output 20 may relate to a display or any other outputting module that is configured to output the signal processed by the (reference) measurement instrument 12, 14 in a certain manner, for instance visually and/or acoustically.

Further, the (reference) measurement instrument 12, 14 comprises a processing module 22 and a storage medium 24.

A signal to be processed by the (reference) measurement instrument 12, 14 is inputted via the respective input 16 and processed by the respective signal processing module 18. The signal processed is than outputted via the respective output 20 of the (reference) measurement instrument 12, 14.

Generally, the (reference) measurement instrument 12, 14 may comprise more than one signal processing module 18. Hence, the signal is processed by several components of the (reference) measurement instrument 12, 14 before being forwarded to the output 20.

During the signal processing, the signal is impacted or rather affected by the at least one signal processing module 18, particularly due to a certain setting of the at least signal processing module 18. In other words, the at least one signal processing module 18 is assigned to at least one instrument parameter that can be set, for instance by an operator of the (reference) measurement instrument 12, 14.

The respective processing module 22 is configured to retrieve an optimal setting for the at least one instrument parameter such that the output signal has optimized characteristics with respect to the input signal. Typically, the optimized characteristics correspond to a minimized measurement uncertainty.

The processing module 22 is generally configured to create a lookup table for a signal of a particular signal type by the (reference) measurement instrument 12, 14. The lookup table created comprises at least the optimal setting retrieved for the at least one instrument parameter assigned to the respective signal processing module 18.

The lookup table created is stored in the respective storage medium 24 such that the lookup table and the information contained therein can be accessed by the respective processing module 22.

Generally, the lookup table created ensures that each measurement instrument of the same series can be configured or rather set in an optimized manner based on the signal type or rather the measurement scenario intended.

Figure 2:
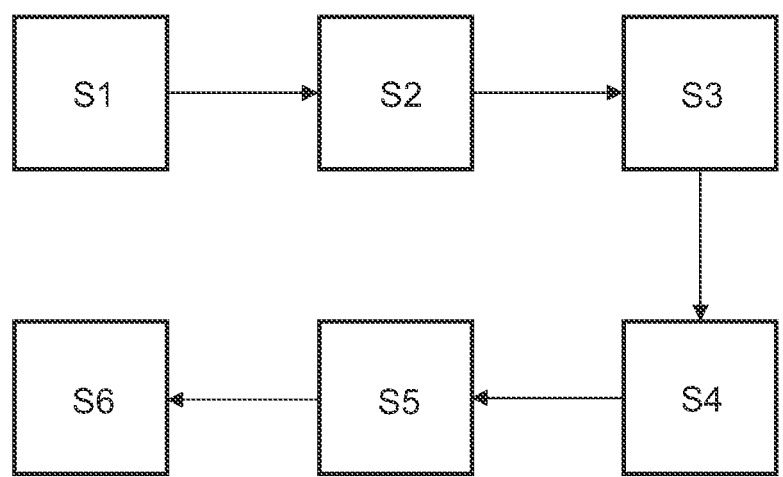
FIG. 2 schematically shows a flow-chart which represents a method of setting a measurement instrument according to the present disclosure.

The configuration will be described hereinafter with reference to FIG. 2 in more detail.

In a first step S1, the reference measurement instrument 14 is provided that uses the at least one instrument parameter for the at least one signal processing module 18. Put differently, the instrument parameter sets the signal processing module 18 in a certain manner or rather influences the processing of the signal by means of the signal processing module 18.

In a second step S2, a training phase for a particular signal type to be processed by the reference measurement instrument 14 is performed in order to retrieve an optimal setting for the at least one instrument parameter that is used by the associated signal processing module 18.

During the training phase, a set of different measurements for this particular signal type may be performed. This means that different measurements are done that have the same certain characteristics, for instance a given bandwidth and time.

In other words, the identical bandwidth and time are used during the training phase in order to determine the optimal setting for the at least one instrument parameter assigned to the signal processing module 18.

In a third step S3, a lookup table for the particular signal type is created, wherein the lookup table comprises at least the optimal setting determined during the previous training phase. The lookup table created may be stored in the storage medium 24 of the reference measurement instrument 14.

In addition, the lookup table may be stored in all storage media 24 of each measurement instrument of the same series, particularly the measurement instrument 12 shown in FIG. 1.

In order to configure the measurement instrument 12 in an optimized manner, an initial measurement is performed on this measurement instrument 12 during a fourth step S4.

Thus, a measurement value is gathered that is assigned to the at least one instrument parameter. For instance, a power level is measured during the initial measurement wherein the initial measurement relates to the same particular signal type that was used during the training phase.

In a fifth step S5, the lookup table stored in the storage medium 24 is accessed in order to retrieve the optimal setting for the at least one instrument parameter based on the measurement value gathered during the initial measurement.

In a sixth step S6, the optimal setting for the at least one instrument parameter is applied on the measurement instrument 12, particularly the at least one signal processing module 18. Thus, the measurement instrument 12 is set in an optimized manner with respect to the particular signal type to be processed.

In general, several optimal settings for several instrument parameters may be retrieved during the training phase performed in step S2. Thus, the lookup table comprises several optimal settings for the respective instrument parameters.

In general, the training phase done in step S2 may relate to a given input power, a crest factor and/or a frequency. Put differently, the particular signal type may be characterized by the above-mentioned characteristics, namely the given input power, the crest factor and/or the frequency.

In a similar manner, the bandwidth and/or the time may be used as entries for the lookup table, particularly an array with more than two dimensions that comprises the lookup table.

The particular signal type may relate to one dimension. However, the signal type may be defined by several characteristics that relate to more than one dimension such that the higher dimensional array is used.

In other words, the particular signal type may be characterized by more than one characteristics such as the given power level, the crest factor, the frequency, the bandwidth and/or the time.

In fact, the instrument parameter assigned to the at least one signal processing module 18 may relate to a signal processing parameter and/or an instrument hardware parameter. The instrument hardware parameter relates to a setting of a hardware component of the respective (reference) measurement instrument 12, 14.

In fact, the instrument parameter may be assigned to an attenuator, a preamplifier, a reference source, a mixer and/or an analog-to-digital converter. The attenuator, the preamplifier, the reference source, the mixer and/or the analog-to-digital converter are hardware components of the (reference) measurement instrument 12, 14. In other words, the at least one signal processing module 18 may relate to the attenuator, the preamplifier, the reference source, the mixer and/or the analog-to-digital converter.

In general, the present disclosure is based on the lookup table that contains the necessary optimal settings for the measurement instrument 12, for instance attenuation, reference level and so on, based on an initial measurement, for instance an initial power measurement. The respective lookup table is specific to the respective measurement instrument 12, particularly the respective series. Further, the respective lookup table is specific for the particular signal type.

Hence, it is ensured that the measurement instrument 12 is configured or rather set in an ideal manner taking the measurement intended into account.

The invention claimed is:

1. A method of setting a measurement instrument, comprising the steps of:
    Providing a reference measurement instrument that uses at least one instrument parameter;
    Performing a training phase for a particular signal type to be processed by said reference measurement instrument in order to find an optimal setting for said at least one instrument parameter, wherein the reference measurement instrument has at least one signal processing module that processes a signal of the particular signal type, wherein during the training phase a set of different measurements for the particular signal type is performed where the different measurements have a same characteristic for one of a given input power, a crest factor, or a frequency, and the same characteristic is use to find the optimal setting for said at least one instrument parameter, and wherein said at least one instrument parameter is adapted during the training phase so as to identify said optimal setting for said at least one instrument parameter;
    Creating a lookup table for said particular signal type, said lookup table comprising at least said optimal setting for said at least one instrument parameter, wherein said lookup table created is specific for at least the particular signal type, and wherein said lookup table is populated during the training phase;
    Configuring the measurement instrument after the training phase by performing an initial measurement on the measurement instrument;
    Accessing the lookup table to retrieve the optimal setting for the instrument parameter based on a measurement value gathered during the initial measurement; and
    Applying the optimal setting for the instrument parameter on the measurement instrument to set the measurement instrument in an optimized manner with respect to the particular signal type to be processed.

2. The method of claim 1, wherein optimal settings for several instrument parameters are determined during said training phase, and wherein said lookup table comprises said optimal settings for said several instrument parameters.

3. The method of claim 1, wherein said instrument parameter relates to at least one of a signal processing parameter and an instrument hardware parameter.

4. The method of claim 1, wherein said instrument parameter is assigned to at least one of an attenuator of said reference measurement instrument, a preamplifier of said reference measurement instrument, a reference source of said reference measurement instrument, a mixer of said reference measurement instrument and an analog-to-digital converter of said reference measurement instrument.

5. The method of claim 1, wherein an array with more than two dimensions is created.

6. The method of claim 1, wherein said training phase is performed for at least one of a given input power, a crest factor and a frequency.

7. The method of claim 1, wherein said reference measurement instrument corresponds to said measurement instrument on which said initial measurement is performed or to a measurement instrument of the same series.

8. A system for setting a measurement instrument, comprising a reference measurement instrument that has at least one signal processing module and a storage medium, said at least one signal processing module being assigned to at least one instrument parameter, said at least one signal processing module being configured to process a signal of a particular signal type, said processing module being configured to find an optimal setting for said at least one instrument parameter during a training phase wherein said at least one instrument parameter is adapted during the training phase to perform a set of different measurements for the particular signal type where the different measurements have a same characteristic for one of a given input power, a crest factor, or a frequency, and the same characteristic is used to identify said optimal setting for said at least one instrument parameter, and said processing module being configured to:

create a lookup table for said particular signal type such that said lookup table created is specific for at least the particular signal type, said lookup table comprising at least said optimal setting for said at least one instrument parameter, wherein said lookup table is populated during the training phase;

configure the measurement instrument after the training phase by performing an initial measurement on the measurement instrument;

access the lookup table to retrieve the optimal setting for the instrument parameter based on a measurement value gathered during the initial measurement; and apply the optimal setting for the instrument parameter on the measurement instrument to set the measurement instrument in an optimized manner with respect to the particular signal type to be processed;

said storage medium being configured to store said lookup table created.

9. The system of claim 8, wherein said instrument parameter assigned to said signal processing module relates to at least one of a signal processing parameter and an instrument hardware parameter.

10. The system of claim 8, wherein said instrument parameter is assigned to at least one of an attenuator of said reference measurement instrument, a preamplifier of said reference measurement instrument, a reference source of said reference measurement instrument, a mixer of said reference measurement instrument and an analog-to-digital converter of said reference measurement instrument.

11. The system of claim 8, wherein said reference measurement instrument corresponds to said measurement instrument on which said initial measurement is performed or to a measurement instrument of the same series.

12. A method of setting a measurement instrument, comprising the steps of:

Providing a reference measurement instrument that uses at least one instrument parameter;

Performing a training phase for a particular signal type to be processed by said reference measurement instrument in order to find an optimal setting for said at least one instrument parameter, wherein during the training phase a set of different measurements for the particular signal type is performed where the different measurements have a same characteristic for one of a given input power, a crest factor, or a frequency, and the same characteristic is used to find the optimal setting for said at least one instrument parameter, and wherein said at least one instrument parameter is adapted during the training phase so as to identify said optimal setting for said at least one instrument parameter;

Creating a lookup table for said particular signal type, said lookup table comprising at least said optimal setting for said at least one instrument parameter, wherein said lookup table is populated during the training phase since entries of said lookup table are generated during said training phase;

Configuring the measurement instrument after the training phase by performing an initial measurement on the measurement instrument;

Accessing the lookup table to retrieve the optimal setting for the instrument parameter based on a measurement value gathered during the initial measurement; and Applying the optimal setting for the instrument parameter on the measurement instrument to set the measurement instrument in an optimized manner with respect to the particular signal type to be processed;

wherein said at least one instrument parameter relates to a signal processing parameter and/or an instrument hardware parameter, wherein the signal processing parameter relates to a software setting according to which a signal of the particular signal type is processed by the reference measurement instrument, and wherein the instrument hardware parameter relates to a setting of a hardware component of the reference measurement instrument.

* * * * *